(12) United States Patent
Jiang

(10) Patent No.: US 12,563,690 B2
(45) Date of Patent: Feb. 24, 2026

(54) DUAL-ROW FIVE-IN-ONE ELECTRICAL OUTLETS WITH CORD LOCKING AND CHASSIS GROUNDING

(71) Applicant: SCHNEIDER ELECTRIC IT CORPORATION, Foxboro, MA (US)

(72) Inventor: Yuchun Jiang, Saint Peters, MO (US)

(73) Assignee: SCHNEIDER ELECTRIC IT CORPORATION

( * ) Notice: Subject to any disclaimer, the term of this patent is extended or adjusted under 35 U.S.C. 154(b) by 169 days.

(21) Appl. No.: 18/367,168

(22) Filed: Sep. 12, 2023

(65) Prior Publication Data

US 2024/0130065 A1 Apr. 18, 2024

Related U.S. Application Data

(60) Provisional application No. 63/416,223, filed on Oct. 14, 2022.

(51) Int. Cl.
*H01R 13/652* (2006.01)
*H01R 25/00* (2006.01)
*H05K 7/14* (2006.01)

(52) U.S. Cl.
CPC ......... *H05K 7/1457* (2013.01); *H01R 13/652* (2013.01); *H01R 25/006* (2013.01); *H05K 7/1492* (2013.01)

(58) Field of Classification Search
CPC .. H05K 7/1457; H05K 7/1492; H01R 13/652; H01R 25/006
USPC ........................................................ 361/788
See application file for complete search history.

(56) References Cited

U.S. PATENT DOCUMENTS

| | | | |
|---|---|---|---|
| 6,220,880 B1 | 4/2001 | Lee et al. | |
| 6,250,956 B1 * | 6/2001 | Pulizzi ................... | H02B 1/044 |
| | | | 439/535 |
| 7,215,535 B2 * | 5/2007 | Pereira ................... | G06F 1/189 |
| | | | 174/59 |
| 8,038,454 B2 | 10/2011 | Jiang et al. | |
| 8,052,437 B2 | 11/2011 | Jiang et al. | |
| 9,054,449 B2 * | 6/2015 | Utz ................... | H01R 13/5812 |
| 9,727,515 B2 * | 8/2017 | Whitney ................ | H04L 67/12 |
| 9,806,438 B2 | 10/2017 | Duncan et al. | |
| 9,843,146 B1 * | 12/2017 | Chen .................... | H01R 13/514 |
| 10,249,998 B2 * | 4/2019 | Irons ..................... | H01R 33/72 |

(Continued)

FOREIGN PATENT DOCUMENTS

| | | | |
|---|---|---|---|
| EP | 3471522 A2 | 4/2019 | |
| EP | 3859907 A2 | 8/2021 | |

OTHER PUBLICATIONS

Extended European Search Report from corresponding European Application No. 23202833.2 dated Mar. 22, 2024.

*Primary Examiner* — Timothy J Thompson
*Assistant Examiner* — Michael F McAllister
(74) *Attorney, Agent, or Firm* — FIG. 1 Patents

(57) ABSTRACT

A rack power distribution unit includes a chassis and at least one outlet unit configured to be coupled to the chassis. The at least one outlet unit includes a socket configured to receive at least two types of plugs. The socket includes a locking lever configured to releasably secure a plug within the socket. The socket may be configured to include a grounding tab configured to be coupled to the chassis. The grounding tab is configured to wrap around a base of the at least one outlet unit and is connected to the chassis by a screw fastener.

30 Claims, 9 Drawing Sheets

(56) References Cited

U.S. PATENT DOCUMENTS

| | | | |
|---|---|---|---|
| 10,505,325 B2 | 12/2019 | Duncan et al. | |
| 10,952,344 B1 * | 3/2021 | Jiang ................... | H05K 7/1405 |
| 11,196,212 B2 * | 12/2021 | Ramsey ............ | H01R 13/6275 |
| 11,831,112 B2 * | 11/2023 | Dittus .................. | H01R 13/514 |
| 11,936,130 B2 * | 3/2024 | Ramsey ............... | H01R 25/006 |
| 2004/0077212 A1 * | 4/2004 | Pulizzi .................. | H02B 1/044 |
| | | | 439/535 |
| 2011/0223785 A1 * | 9/2011 | Jiang ................. | H01R 13/6272 |
| | | | 439/106 |
| 2013/0143428 A1 * | 6/2013 | Chang ............... | H01R 13/6275 |
| | | | 439/357 |
| 2017/0104294 A1 | 4/2017 | Krietzman et al. | |
| 2019/0140410 A1 * | 5/2019 | Hutchison .............. | H01R 27/00 |
| 2022/0200218 A1 * | 6/2022 | Dittus ................... | H01R 31/02 |

* cited by examiner

22

22

22

38a

46a

22

38a

22

5E

38b

5E

38a

22

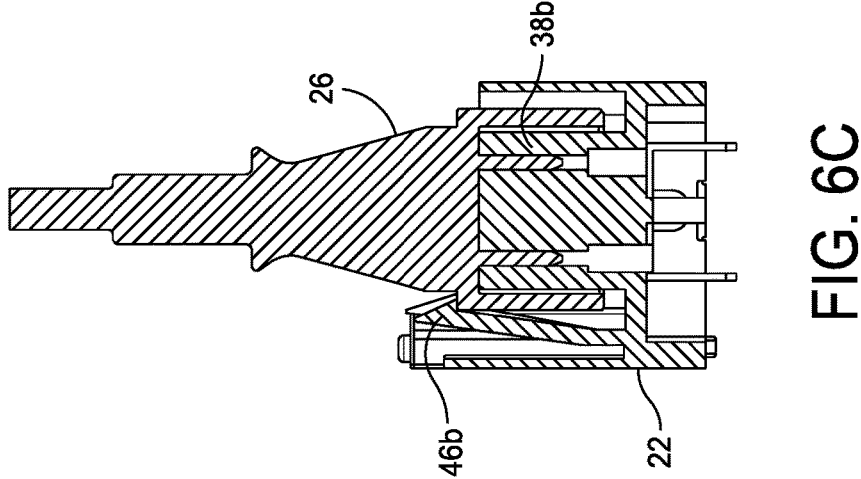
FIG. 6C
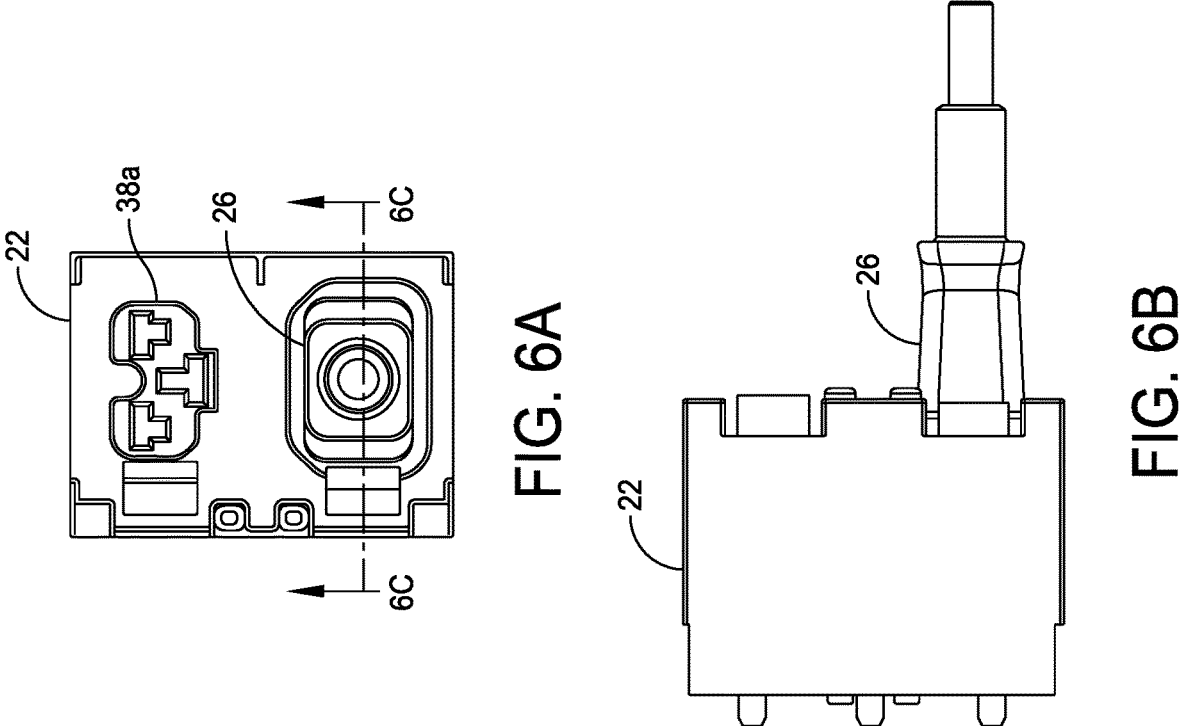
FIG. 6A
FIG. 6B

DUAL-ROW FIVE-IN-ONE ELECTRICAL OUTLETS WITH CORD LOCKING AND CHASSIS GROUNDING

CROSS-REFERENCE TO RELATED APPLICATION

This application claims the benefit under 35 U.S.C. § 119(e) of U.S. Provisional Patent Application No. 63/416,223 titled DUAL-ROW FIVE-IN-ONE ELECTRICAL OUTLETS WITH CORD LOCKING AND CHASSIS GROUNDING filed on Oct. 14, 2022, which is incorporated herein by reference in its entirety for all purposes.

BACKGROUND OF DISCLOSURE

1. Field of Disclosure

Aspects and embodiments of the present invention are directed generally to electronic equipment mounting racks, and more specifically, to power distribution units having outlets with cord locking and chassis grounding capabilities.

2. Discussion of Related Art

In response to the increasing demands of information-based economies, information technology networks continue to proliferate across the globe. One manifestation of this growth is the centralized network data center. A centralized network data center typically consists of various information technology equipment, co-located in a structure that provides network connectivity, electrical power, and cooling capacity. Often the equipment is housed in specialized enclosures termed "racks" which integrate these connectivity, power and cooling elements.

Equipment racks may include power distribution and wire management systems coupled to the racks to supply power and communication lines to the equipment in the racks. A type of power distribution system often used in electronic equipment racks, referred to as a "Rack Power Distribution Unit" or "rPDU," includes multiple electrical outlets of the same or different specification for supplying power to equipment in a rack. One or more rPDUs may be mounted, for example, on one or both sides of a front and/or a rear of an equipment rack. Such rPDUs may include elongated power strips having multiple outlets or receptacles configured to receive various types of plugs. It is desired that the plugs are securely received within their respective outlets and adequately grounded.

SUMMARY OF DISCLOSURE

One aspect of the present disclosure is directed to a rack power distribution unit comprising a chassis including at least one outlet cutout formed therein and at least one outlet unit configured to be positioned within the at least one outlet cutout. The at least one outlet unit includes a socket configured to receive one of five types of plugs, and a locking lever configured to secure a plug within the socket.

Another aspect of the present disclosure is directed to a rack power distribution unit comprising a chassis including at least one outlet cutout formed therein and at least one outlet unit configured to be positioned within the at least one outlet cutout. The at least one outlet unit includes a socket configured to receive one of five types of plugs, and a grounding tab configured to be grounded directly to the chassis.

Yet another aspect of the present disclosure is directed to a rack power distribution unit comprising a chassis and at least one outlet unit configured to be coupled to the chassis. The at least one outlet unit includes a socket configured to receive at least two types of plugs. The socket includes a locking lever configured to releasably secure a plug within the socket.

Embodiments of the rack power distribution unit further may include the socket including a base and at least one outlet projecting from the base. The locking lever may extend from the base and is positioned adjacent to the at least one outlet. The at least one outlet of the socket may include two outlets projecting from the base. The socket further may include at least one side wall projecting from the base adjacent to one side of the at least one outlet. The locking lever may extend from the base and may be positioned between one of the at least one side wall and the second side wall and the at least one outlet. The at least one side wall may include a first side wall located adjacent to one side of the at least one outlet and a second side wall located adjacent to an opposite side of the at least one outlet. The at least one side wall may include an elongated opening formed therein, with the elongated opening being configured to receive a light pipe therein. The at least one side wall may include a surface provided on top of the at least one side wall, with the surface being configured to receive a label. The locking lever may include a hook portion configured to engage a shoulder of the plug to retain the plug within the socket. The locking lever may be configured to flex or bend to release the plug from the socket. The socket may include a base, at least one outlet projecting from the base, and two side walls projecting from the base adjacent sides of the at least one outlet. Each side wall may include at least one snap-in tab configured to be releasably secured to at least one mating feature formed in the chassis. The at least two types of plugs may include at least four types of plugs. The at least one outlet unit further may include a grounding tab configured to be coupled to the chassis. The grounding tab may be configured to wrap around a base of a socket of the at least one outlet unit and is connected to the chassis by a fastener.

Another aspect of the present disclosure is directed to a rack power distribution unit comprising a chassis and at least one outlet unit configured to be coupled to the chassis. The at least one outlet unit includes a socket configured to receive at least two types of plugs and a grounding tab configured to be coupled to the chassis. The grounding tab is configured to wrap around a base of the at least one outlet unit and is connected to the chassis by a screw fastener. The at least two types of plugs may include at least four types of plugs.

Another aspect of the present disclosure is directed to an outlet-unit assembly comprising at least one outlet unit configured to be coupled to a chassis. The at least one outlet unit includes a socket configured to receive at least two types of plugs. The socket includes a locking lever configured to releasably secure a plug within the socket.

Embodiments of the outlet-unit assembly further may include the socket further including a base and at least one outlet projecting from the base. The locking lever may extend from the base and is positioned adjacent to the at least one outlet. The at least one outlet of the socket may include two outlets projecting from the base. The socket further may include at least one side wall projecting from the base adjacent to one side of the at least one outlet. The locking lever may extend from the base and may be positioned between one of the at least one side wall and the second side wall and the at least one outlet. The at least one side wall may include a first side wall located adjacent to one side of the at least one outlet and a second side wall located adjacent to an opposite side of the at least one outlet. The at least one side wall includes an elongated opening formed therein, the elongated opening being configured to receive a light pipe therein. The at least one side wall may include a surface provided on top of the at least one side wall, with the surface being configured to receive a label. The locking lever may include a hook portion configured to engage a shoulder of the plug to retain the plug within the socket. The locking lever may be configured to flex or bend to release the plug from the socket. The socket may include a base, at least one outlet projecting from the base, and two side walls project- ing from the base adjacent sides of the at least one outlet. Each side wall may include at least one snap-in tab config- ured to be releasably secured to at least one mating feature formed in the chassis. The at least two types of plugs may include at least four types of plugs. The at least one outlet unit further may include a grounding tab configured to be coupled to the chassis. The grounding tab may be configured to wrap around a base of a socket of the at least one outlet unit and may be connected to the chassis by a fastener.

Yet another aspect of the present disclosure is directed to an outlet-unit assembly comprising at least one outlet unit configured to be coupled to a chassis. The at least one outlet unit includes a socket configured to receive at least two types of plugs and a grounding tab configured to be coupled to the chassis.

Embodiments of the outlet-unit assembly further may include configuring the grounding tab to wrap around a base of a socket of the at least one outlet unit and is connected to the chassis by a fastener. The at least two types of plugs may include at least four types of plugs.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every com- ponent may be labeled in every drawing. In the drawings:

FIGS. 6A-6C are views showing a C14 plug secured to an outlet assembly of an embodiment of the present disclosure;

DETAILED DESCRIPTION

Figure 1:
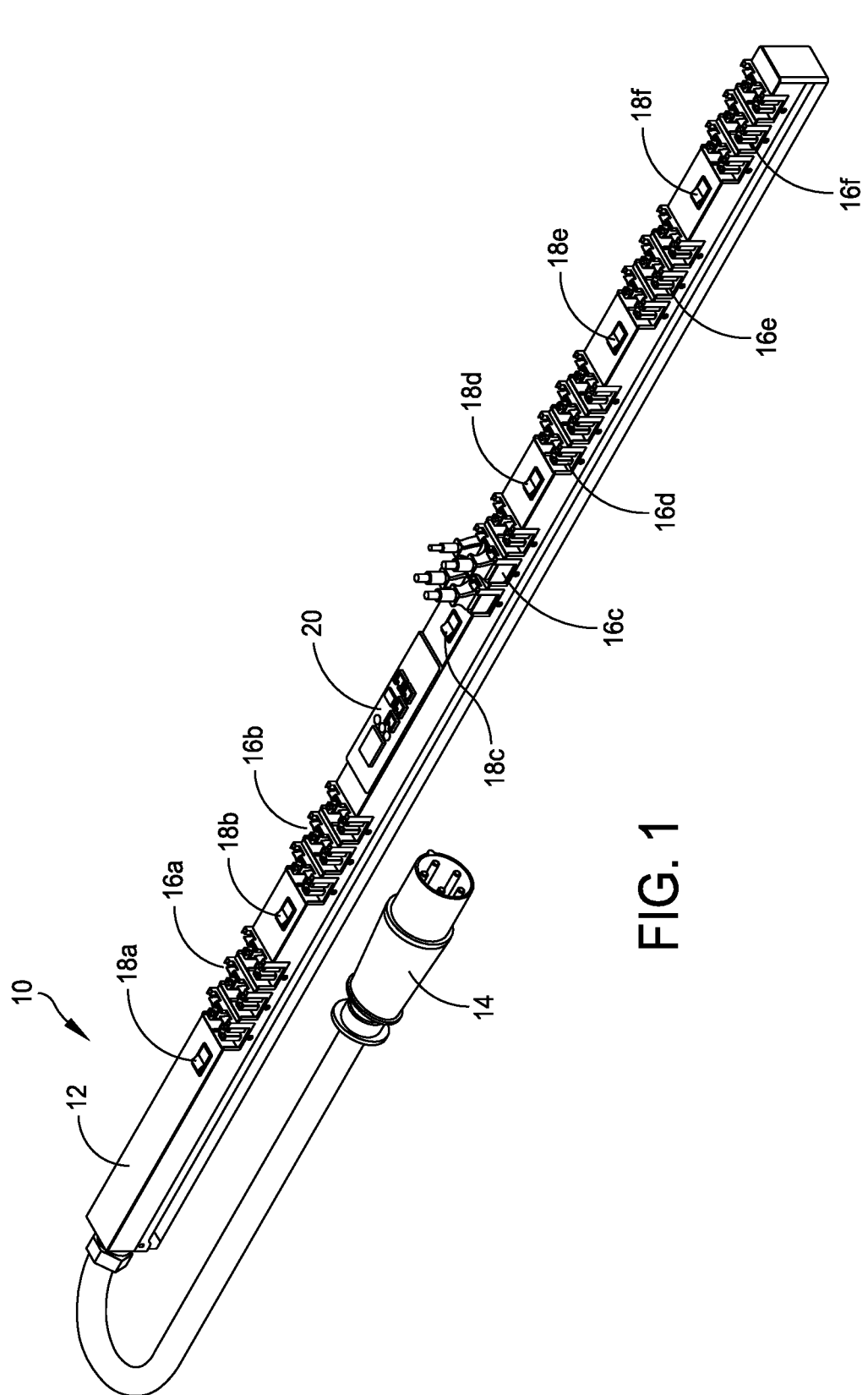
FIG. 1 is a perspective view of a rack Power Distribution Unit (rPDU) having a chassis and several outlet assemblies of the present disclosure.

Embodiments of the present disclosure are directed gen- erally to a rack power distribution unit (rPDU) capable of providing power via outlets of the same or a different type arranged according to a desired configuration. The rPDU can be easily adapted to customer specifications identifying an arrangement of outlet types, and provides significant reduc- tions in fabrication time, complexity, and cost.

Examples of the methods and systems discussed herein are not limited in application to the details of construction and the arrangement of components set forth in the follow- ing description or illustrated in the accompanying drawings. The methods and systems are capable of implementation in other embodiments and of being practiced or of being carried out in various ways. Examples of specific imple- mentations are provided herein for illustrative purposes only and are not intended to be limiting. In particular, acts, components, elements and features discussed in connection with any one or more examples are not intended to be excluded from a similar role in any other examples.

When a customer purchases a rPDU, the customer often- times cannot find the ideal combination of different types of outlets in a specific SKU. Embodiments of the present disclosure provide a versatile five-in-one outlet configura- tion that can be used as one of five conventional outlets. Embodiments of the present disclosure further include a cord retention/locking feature to prevent the cord plugs being pulled away from their respective outlets accidentally.

Specifically, embodiments of the present disclosure include a rPDU including a dual-row electrical outlets. Each individual outlet is a versatile five-in-one outlet that can serve as a C13/C15/C15A/C19/C21 outlet, which are con- figured to receive C14/C16/C16A/C20/C22 connectors or plugs, respectively. Each outlet includes a built-in cord- locking lever. The outlets have chassis-grounding features implemented with side mounting of the rPDU. The rPDU has lower side walls in outlet areas to accommodate dual C20/C22 plugs in a relatively narrow chassis. The outlets also have built-in light pipes and outlet label placement spaces.

In some embodiments, each dual block has two five-in- one combo outlets that can be used as a C13/C15/C15A/ C19/C21 outlet. This construction is configured to achieve high outlet counts in a rPDU and full flexibility in all outlets.

In some embodiments, a cord retention feature, e.g., a locking lever, is used to lock a shoulder of a mating plug.

In some embodiments, each outlet is independently and directly grounded to rPDU chassis through built-in ground bar or tab and side mounting method.

In some embodiments, each outlet has a pad area for placing an outlet ID label.

In some embodiments, the outlet has no side walls facing sides of rPDU and rPDU chassis walls are cut out in outlet areas. This is to achieve high outlet counts and potentially better thermal conditions.

In some embodiments, to install a power cord, a user may lean the plug edge against the angled hook surface and push the plug into the outlet. To remove the power cord, the user will pull/push the locking lever away from the plug and pull the plug out of the outlet.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

An exemplary electronic equipment rack (also referred to herein simply as a "rack") includes several drawer enclosures that are configured to support power and/or network connections for other equipment mounted in the rack. Uninterruptible Power Supplies (UPSs) may be installed as rack mounted devices to increase the power supply redundancy of the rack. The rack further may include computing or network technology equipment, for example, one or more data storage devices, a server, a patch panel, a keyboard tray, a cable organizer, and/or a monitor or other user interface, which may provide for an operator to communicate with the equipment in the rack. The rack further may be configured in any manner desired by the end user. A rPDU may be mounted internal to the rack in which the rPDU may be vertically mounted or may be horizontally mounted in the rack along with the other equipment in the rack. The rPDU may receive power from the UPSs in the rack, or directly from an AC utility supply, and may include power outlets to which power cords from the various other equipment in the rack may be electrically connected.

FIG. 1 illustrates one example of a rPDU, generally indicated at 10, including outlets of varied types. The rPDU 10 includes an elongated rectangular chassis 12 having a plug 14 provided on an end of the chassis and several outlet banks, indicated at 16a, 16b, 16c, 16d, 16e, 16f, provided on the front side of the chassis. Each outlet bank 16a, 16b, 16c, 16d, 16e, 16f includes a total of six outlets, sometimes referred to herein as "sockets," but can be configured to include any number of outlets. With embodiments of the present disclosure, each outlet bank 16a, 16b, 16c, 16d, 16e, 16f includes outlets that can serve as one of five outlet types, e.g., C13/C15/C15A/C19/C21 outlets. As used herein, "receiving at least two types of plugs" may mean that the outlets are configured to receive a plug that could be a C14, C16, C16A, C20, C22, or some other type of plug. In some embodiments, a socket configured to receive at least two types of plugs may be a socket configured to receive four types of plugs, e.g., a plug that could be a C14, C16, C20, C22, or some other type of plug, or a socket configured to receive five types of plugs, e.g., a plug that could be a C14, C16, C16A, C20, C22, or some other type of plug.

As shown, the rPDU 10 includes six outlet banks 16a, 16b, 16c, 16d, 16e, 16f provided on the front side of the chassis; however, it should be understood that the rPDU can be configured with any number of outlet banks. In normal operation, the rPDU 10 is configured to receive power via the plug 14, which is connected, for example, to an AC mains power supply or to a UPS, such as the UPS provided in the rack. The power received via the plug 14 is distributed to each outlet of the outlet banks 16a, 16b, 16c, 16d, 16e, 16f to provide power to devices connected thereto. Each power bank 16a, 16b, 16c, 16d, 16e, 16f includes a dedicated circuit breaker 18a, 18b, 18c, 18d, 18e, 18f to protect equipment connected to the power bank. The rPDU 10 further includes a user interface 20 to control the operation of the rPDU and to provide an operator useful information about the operation parameters of the rPDU.

It should be understood that the rPDU 10 may embody any number of configurations. For example, the chassis 12 may be configured to achieve a desired shape or length. Further, the configuration and number of outlet banks 16a, 16b, etc., may be varied depending on the intended use of the rPDU 10.

Figure 2:
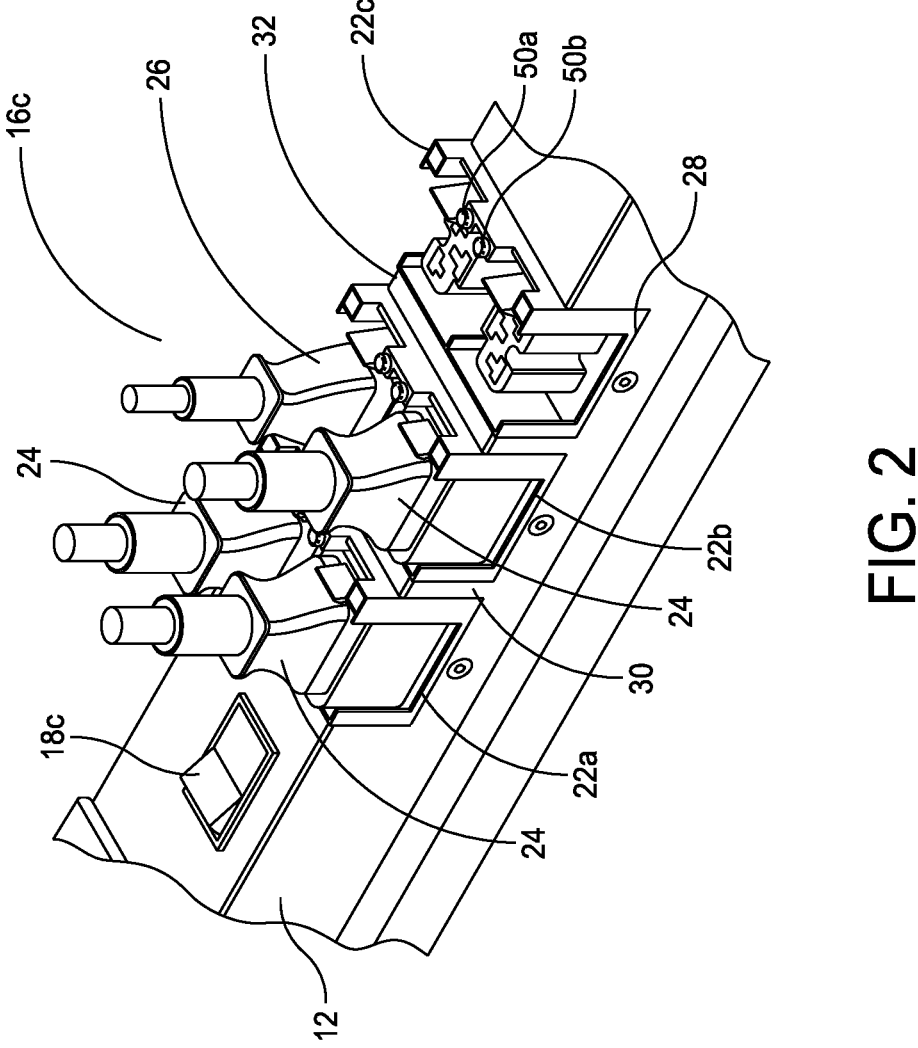
FIG. 2 is an enlarged perspective view of several outlet assemblies shown in FIG. 1 with the outlet assemblies being secured to the chassis.

Referring to FIG. 2, an exemplary outlet bank, e.g., outlet bank 16c, is shown, having three, dual-outlet units 22a, 22b, 22c, which are releasably secured to the chassis 12. As will be described in greater detail below, each outlet of the outlet unit 22a, 22b, 22c is configured to receive C14/C16/C16A/ C20/C22 plugs. As shown, one outlet unit, e.g., outlet unit 22a, has two C20 plugs, each indicated at 24, connected to the respective outlets. Another outlet unit, e.g., outlet unit 22b, has one C14 plug 26 and one C20 plug 24 connected to respective outlets. Each outlet unit 22a, 22b, 22c is a modular unit that is configured to be received within an opening 28 within chassis 12 and to be easily installed and uninstalled. As shown, the chassis 12 includes a narrow or thin wall 30 to separate modular unit 22a from modular unit 22b. Another narrow wall 32 is provided to separate modular unit 22b from modular unit 22c. Each outlet unit 22a, 22b, 22c, when mounted on the chassis 12 has open ends to enable the plugs, e.g., plugs 24, 26 to fit within the outlet unit. The chassis 12 further is configured without a side wall in the locations of the outlet units 22a, 22b, 22c to create the open ends.

Figures 3, 4:
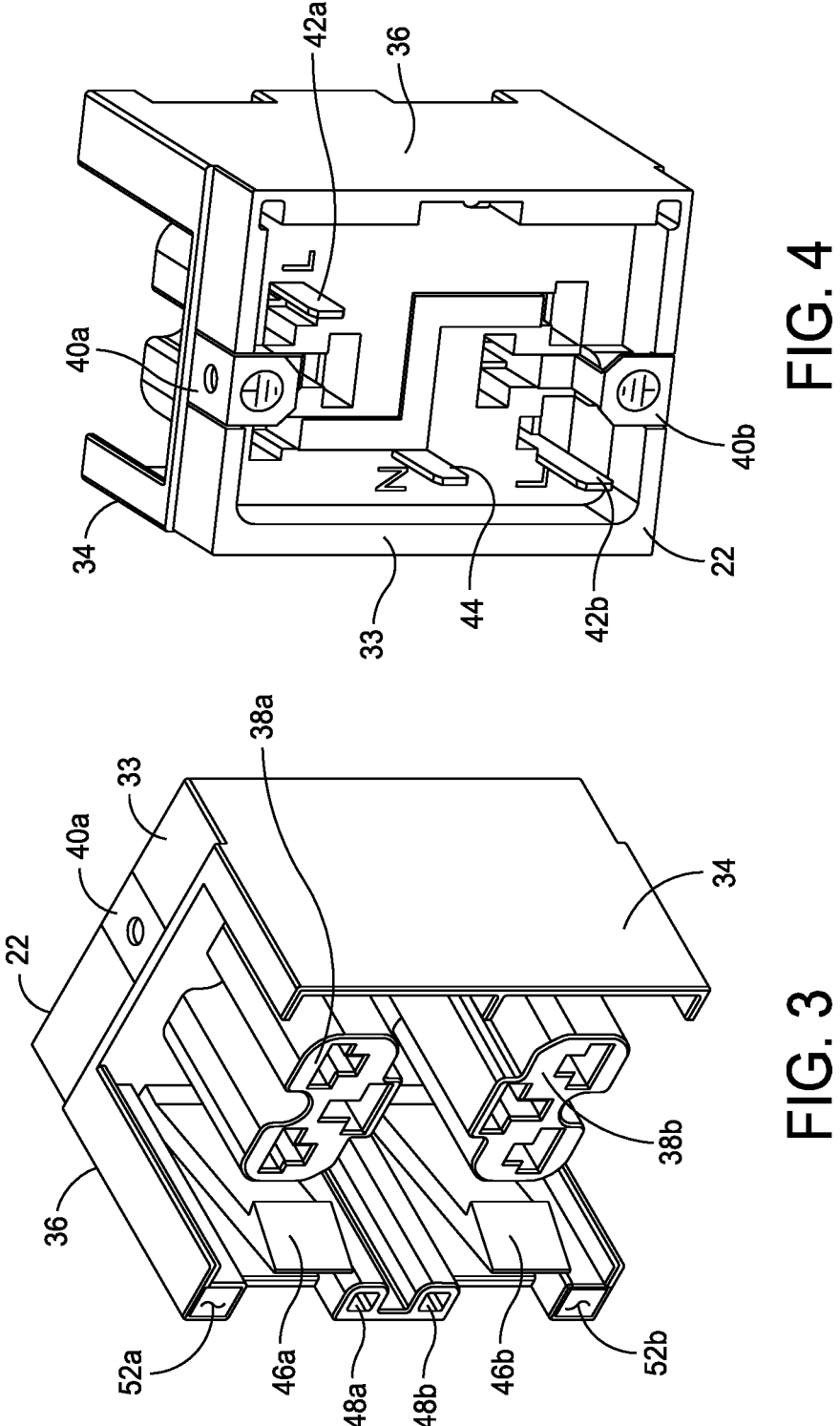
FIG. 3 is a front perspective view of an outlet assembly shown in FIG. 2.
FIG. 4 is a back perspective view of the outlet assembly shown in FIG. 3.

Referring additionally to FIGS. 3 and 4, an exemplary outlet unit 22 includes a base 33, a side wall 34, and an opposite side wall 36. As shown in FIG. 4, the outlet unit 22 includes two outlets 38a, 38b configured to receive a plug, e.g., plugs 24 or 26. Each outlet 38a, 38b of the outlet unit 22 includes a ground terminal or tab 40a, 40b, a live terminal 42a, 42b and a common neutral terminal 44. Each ground terminal 40a, 40b wraps around the base 33 and is connected to the chassis 12 by a suitable screw fastener. In some embodiments, only some outlets of the outlet unit 22, such as outlet 38a, may include a ground terminal, such as ground terminal or tab a. In some embodiments, none of the outlets of the outlet unit 22 may include a ground terminal or tab 40a, 40b.

As shown, side wall 34 is a relatively narrow or thin wall that is positioned adjacent to the chassis 12 when installing the outlet unit 22 on the chassis. Side wall 36 is a relatively thicker wall to protect locking levers or hooks 46a, 46b, which are designed to retain respective plugs when fully installed within the outlet unit 22. As shown in FIG. 2, each locking lever 46a, 46b is configured to engage a shoulder of the plug to retain the plug within the outlet unit. Each locking lever 46a, 46b is designed to flex or bend to release the plug from the outlet unit 22. Specifically, the locking lever 46a, 46b can be moved away from the plug by applying a force at the tip of the locking lever with a finger or thumb to move the locking lever and to enable the release of the plug from the outlet unit. The thicker side wall 36 protects the locking levers during use and handling.

Referring particularly to FIG. 3, each outlet unit 22 includes two elongated openings 48a, 48b provided in the thicker wall 36 of the outlet unit to receive light pipes therein, e.g., light pipes 50*a*, 50*b* shown in FIG. 2. As shown, each opening 48*a*, 48*b* extends from a top surface of the wall through the wall toward the base 33. The light pipes, e.g., light pipes 50*a*, 50*b*, are inserted into their respective openings 48*a*, 48*b* to indicate a status of its respective outlet 38*a*, 38*b*. Each outlet unit 22 further includes two surfaces 52*a*, 52*b* provided on top of the thicker wall 36 of the outlet unit to receive a label or some other type of mark to designate the outlet 38*a*, 38*b*, respectively.

Figures 5A, 5B, 5C, 5D, 5E:
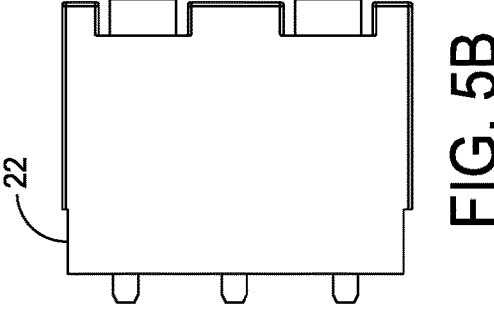
FIGS. 5A-5E are views of an outlet assembly of an embodiment of the present disclosure.

Referring to FIGS. 5A-5E, an exemplary outlet unit 22 is shown. FIG. 5A illustrates the shapes of the outlets 38*a*, 38*b* of each outlet unit, with the shape being configured to receive each of C14/C16/C16A/C20/C22 plugs. FIG. 5E illustrates the locking lever 46*a* being biased toward the center of the outlet 38*a* so that when a plug is secured within the outlet, the locking lever engages the shoulder of the plug to retain the plug in a secure position.

Referring to FIGS. 6A-6C, an exemplary outlet unit 22 is shown with a C14 plug 26 being secured to one of the outlets, e.g., outlet 38*b*, of the outlet unit. As shown, a hook of the locking lever 46*b* engages a shoulder of the plug 26 to secure the plug in position within the outlet. The plug 26 can be released by moving the hook of the locking lever 46*b* away from the shoulder thereby providing clearance of the plug from the locking lever. In this position, the plug 26 can be pulled away and removed from the outlet 38*b* of the outlet unit 22.

Figures 7A, 7B, 7C:
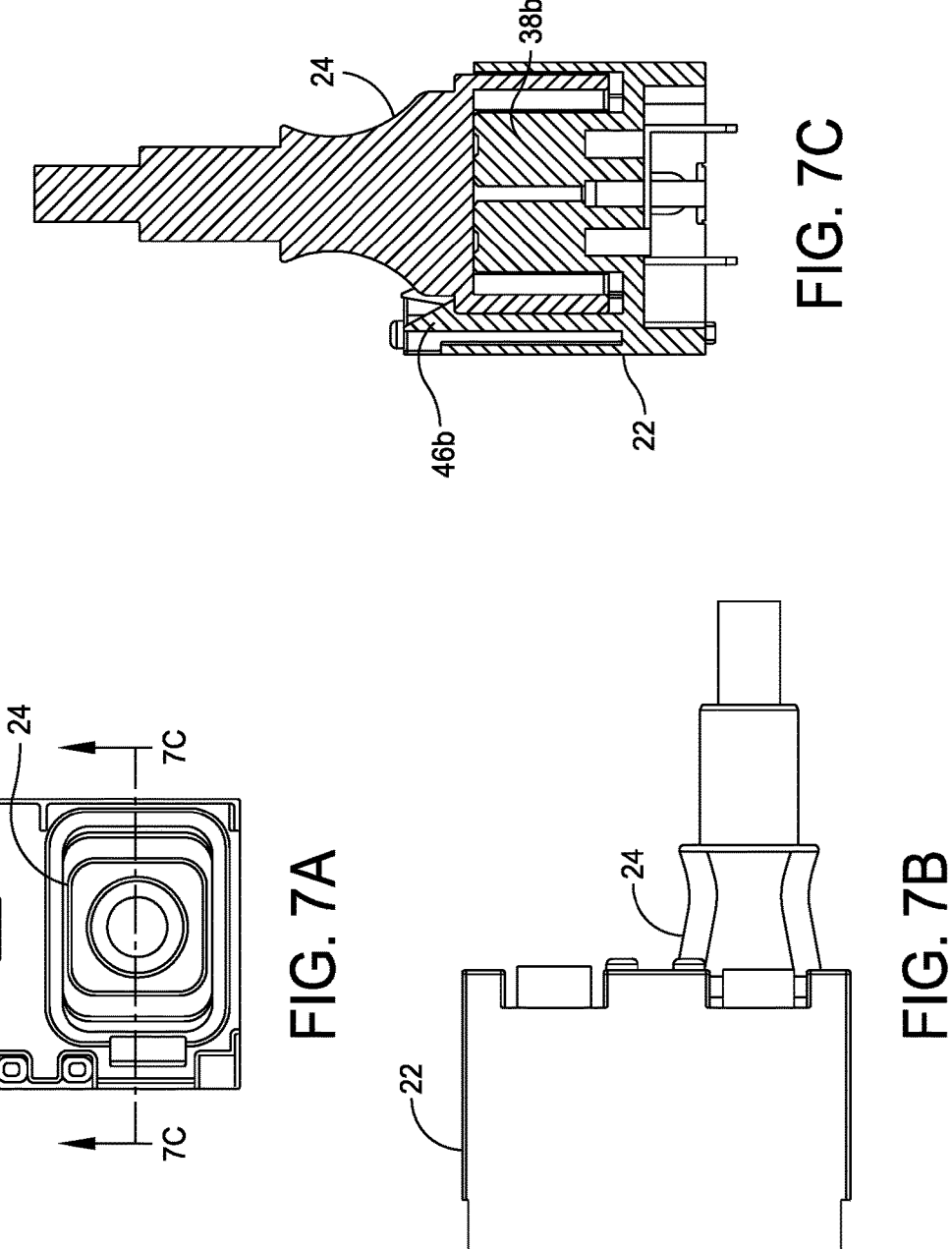
FIGS. 7A-7C are views showing a C20 plug secured to an outlet assembly of another embodiment of the present dis- closure.

Referring to FIGS. 7A-7C, an exemplary outlet unit 22 is shown with a C20 plug 24 being secured to one of the outlets, e.g., outlet 38*b*, of the outlet unit. As shown, a hook of the locking lever 46*b* engages a shoulder of the plug 24 to secure the plug in position within the outlet. The plug 24 can be released by moving the hook of the locking lever 46*b* away from the shoulder thereby providing clearance of the plug from the locking lever. In this position, the plug 24 can be pulled away and removed from the outlet 38*b* of the outlet unit 22.

Figure 8:
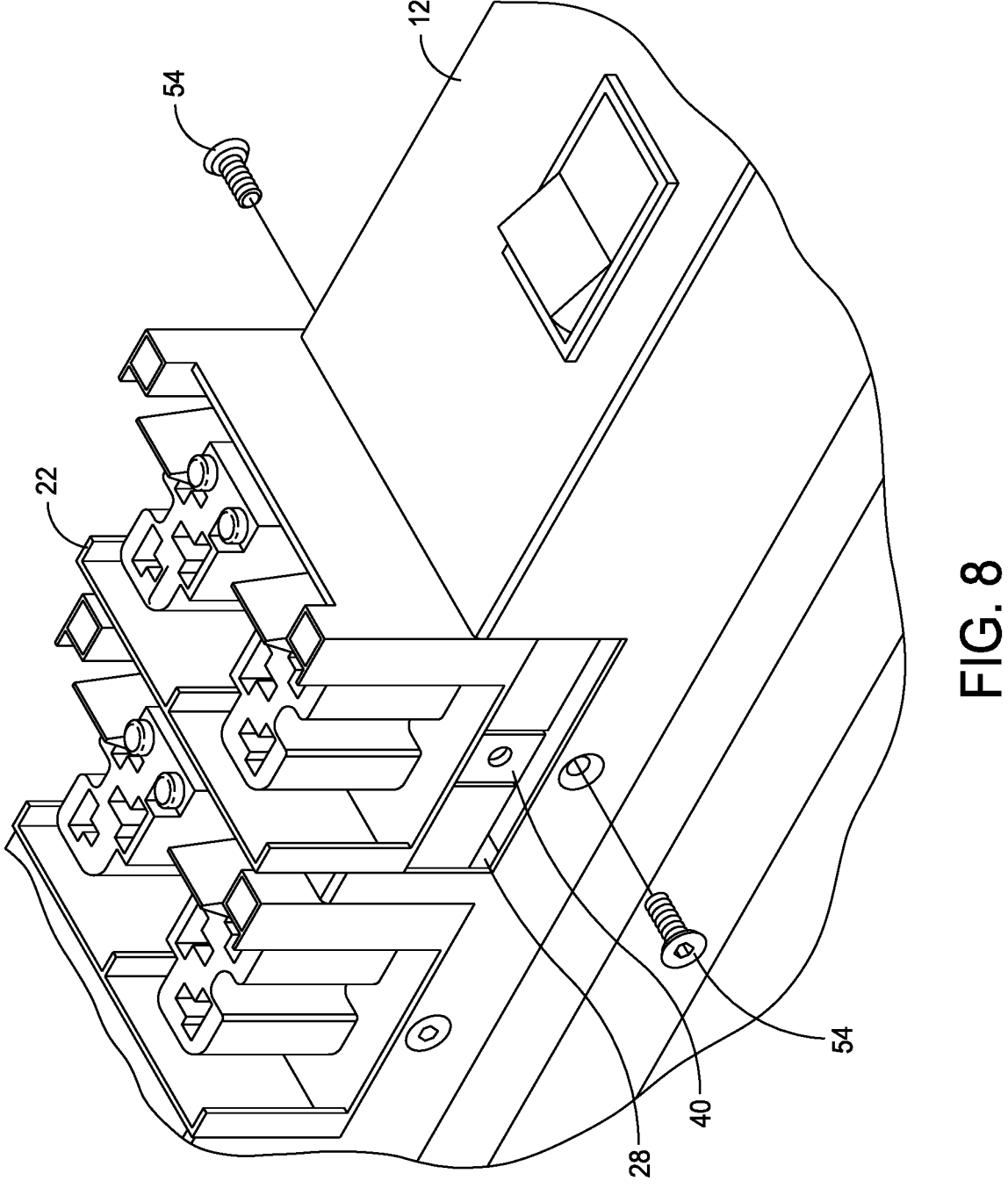
FIG. 8 is an enlarged perspective view showing a ground of an outlet assembly to a chassis of the rPDU.

Referring to FIG. 8, an exemplary outlet unit 22 is shown prior to being fully seated within an opening 28 of the chassis 12. As shown, two screw fasteners, each indicated at 54, are used to secure the outlet unit 22 within the chassis 12, with the surfaces of the ground tabs 40 making contact with inside wall surfaces of the chassis of the rPDU 10. The securing of the chassis 12 to the ground tabs 40 provides a suitable ground for the outlet unit of the rPDU.

Figure 9:
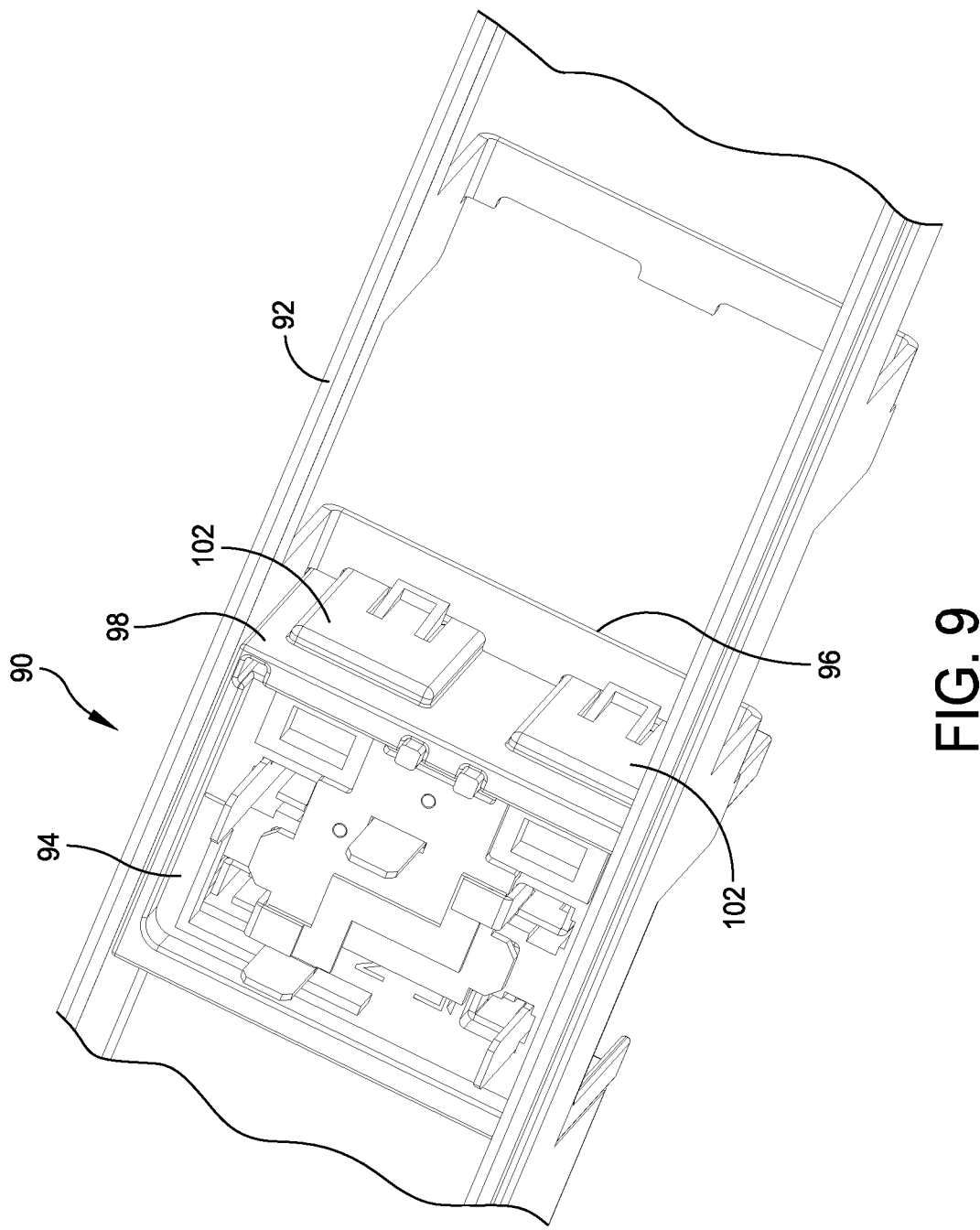
FIG. 9 is a perspective view of a portion of a rPDU having a chassis of another embodiment of the disclosure.
Figure 11:
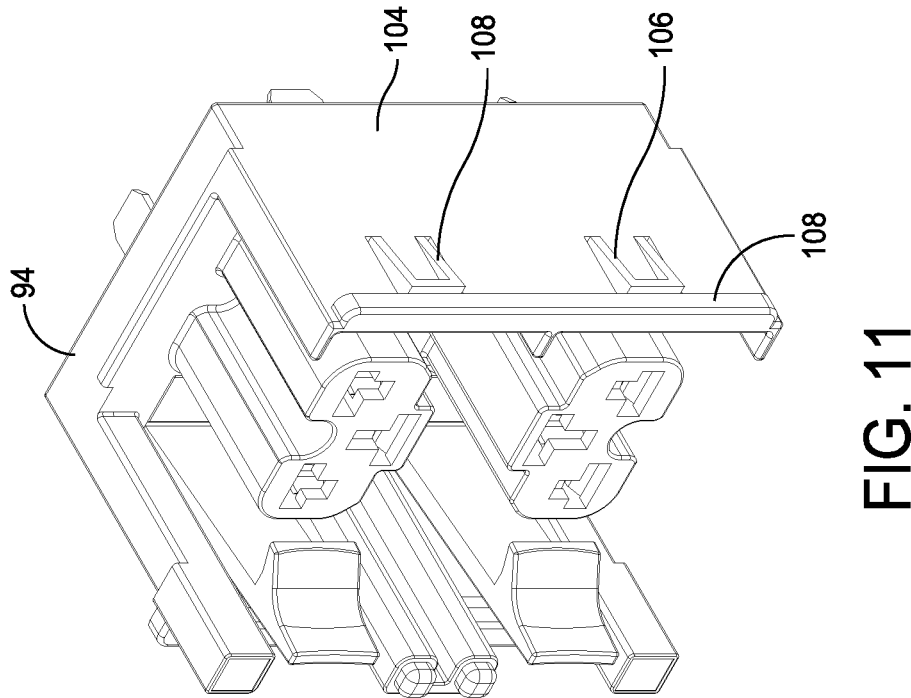
FIG. 11 is another perspective view of the outlet assembly shown in FIG. 10.
Figure 10:
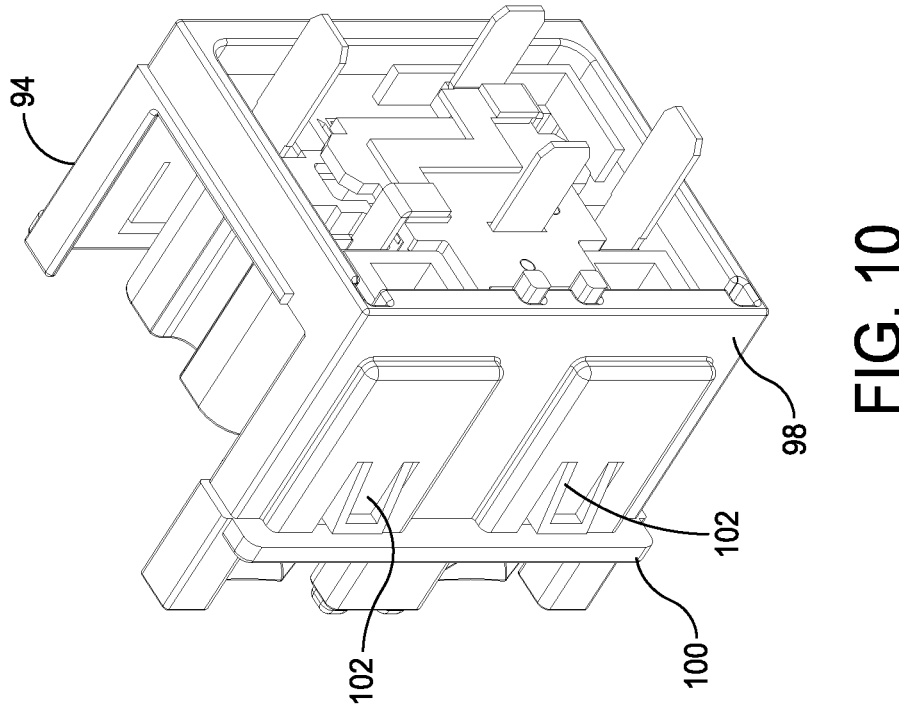
FIG. 10 is a perspective view of an outlet assembly of another embodiment of the present disclosure.

Referring to FIGS. 9-11, and more particularly to FIG. 9, a portion rPDU of another embodiment is generally indicated at 90. As shown, the rPDU includes a chassis 92 configured to receive one or more outlet unit 94, which are shown in FIGS. 10 and 11. As shown, the chassis 92 includes a cutout 96, which is shaped and sized to receive the outlet unit 94. The outlet unit 94 includes a first side wall 98 having a flange 100 and two snap-in tabs, each indicated at 102. The outlet unit 94 further includes a second side wall 104 having a flange 106 and two mating snap-in tabs, each indicated at 108. FIG. 9 illustrates the outlet unit 94 received within the cutout 96 of the chassis 92, with the flanges 100, 106 engaging edges of the cutout 96 and the side wall 98 and the snap-in tabs 102 being shown. The arrangement is such that when inserting another outlet unit into the cutout 96 of the chassis 92 with the mating snap-in tabs facing the snap-in tabs 102 of the outlet unit 94 shown in FIG. 9, the mating snap-in tabs releasably engage the snap-in tabs to secure the outlet unit in place.

The electrical outlet assemblies of embodiments of the present disclosure allow flexible combinations of different types of outlets in a common rPDU chassis. This construction simplifies manufacturing processes and customization requirements. Customization is a fast-growing trend in the rPDU market, and the outlet assemblies and chassis design enable quick and easy customization.

In some embodiments, each outlet assembly includes the same outer body size and locking levers to enable the outlet assembly to be installed into identical outlet cutouts provided on the chassis of the rPDU.

In some embodiments, each outlet assembly includes the same light pipes and light locations so the outlet assembly can use the same LED light sources on the same outlet PCB.

In some embodiments, the light pipe is made of clear plastic material.

In some embodiments, each outlet assembly includes the ground tab designed so that the outlet assembly is directly grounded to the metal chassis to simplify the outlet PCB design and rPDU manufacturing. The metal ground tab can be fabricated from copper, for example.

In some embodiments, the body of the outlet assembly can be fabricated from Underwriters Laboratories (UL)-approved Nylon 6 material, is filled approximately 20% with glass, and has a V-2 flammability rating or other thermoplastics with a V-0 flammability rating. The physical profile of the outlet assembly can be constructed to fit into a corresponding outlet cutout provided in the chassis.

Having thus described several aspects of at least one embodiment, it is to be appreciated that various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A rack power distribution unit comprising:
a chassis including at least one cutout; and
at least one outlet unit configured to be coupled to the chassis, the at least one outlet unit including a base, at least one outlet projecting from the base and configured to receive at least two types of plugs, a locking lever configured to releasably secure a plug within the at least one outlet, and two side walls projecting from the base of the at least one outlet, each side wall including at least one snap-in tab configured to engage edges of the at least one cutout to secure the at least one outlet unit within the at least one cutout of the chassis.

2. The rack power distribution unit of claim 1, wherein the locking lever extends from the base and is positioned adjacent to the at least one outlet.

3. The rack power distribution unit of claim 1, wherein the at least one outlet includes two outlets projecting from the base.

4. The rack power distribution unit of claim 1, wherein the locking lever extends from the base and is positioned between one of the two side walls and the at least one outlet.

5. The rack power distribution unit of claim 1, wherein the two side walls include a first side wall located adjacent to one side of the at least one outlet and a second side wall located adjacent to an opposite side of the at least one outlet.

6. The rack power distribution unit of claim 1, wherein one side wall of the two side walls includes an elongated opening formed therein, the elongated opening being configured to receive a light pipe therein.

7. The rack power distribution unit of claim 1, wherein one side wall of the two side walls includes a surface provided on top of the one side wall, the surface being configured to receive a label.

8. The rack power distribution unit of claim 1, wherein the locking lever includes a hook portion configured to engage a shoulder of the plug to retain the plug within the at least one outlet.

9. The rack power distribution unit of claim 1, wherein the locking lever is configured to flex or bend to release the plug from the at least one outlet.

10. The rack power distribution unit of claim 1, wherein the at least two types of plugs include at least four types of plugs.

11. The rack power distribution unit of claim 1, wherein the at least one outlet unit further includes a grounding tab configured to be coupled to the chassis.

12. The rack power distribution unit of claim 11, wherein the grounding tab is configured to wrap around the base of the at least one outlet unit and is connected to the chassis by a fastener.

13. A rack power distribution unit comprising:

a chassis; and at least one outlet unit configured to be coupled to the chassis, the at least one outlet unit including at least one outlet configured to receive at least two types of plugs and a grounding tab configured to be coupled to the chassis, wherein the grounding tab is connected to the chassis by a screw fastener.

14. The rack power distribution unit of claim 13, wherein the grounding tab is configured to wrap around a base of the at least one outlet unit.

15. The rack power distribution unit of claim 13, wherein the at least two types of plugs include at least four types of plugs.

16. An outlet-unit assembly, comprising:

at least one outlet unit configured to be coupled to a chassis within a cutout of the chassis, the at least one outlet unit including a base, at least one outlet projecting from the base and configured to receive at least two types of plugs, a locking lever configured to releasably secure a plug within the at least one outlet, and two side walls projecting from the base of the at least one outlet, each side wall including at least one snap-in tab configured to engage edges of the cutout to secure the outlet unit within the cutout of the chassis.

17. The outlet-unit assembly of claim 16, wherein the locking lever extends from the base and is positioned adjacent to the at least one outlet.

18. The outlet-unit assembly of claim 16, wherein the at least one outlet includes two outlets projecting from the base.

19. The outlet-unit assembly of claim 2, wherein the locking lever extends from the base and is positioned between one side wall of the two side walls and the at least one outlet.

20. The outlet-unit assembly of claim 16, wherein the two side walls include a first side wall located adjacent to one side of the at least one outlet and a second side wall located adjacent to an opposite side of the at least one outlet.

21. The outlet-unit assembly of claim 16, wherein one side wall of the two side walls includes an elongated opening formed therein, the elongated opening being configured to receive a light pipe therein.

22. The outlet-unit assembly of claim 16, wherein one side wall of the two side walls includes a surface provided on top of the at least one side wall, the surface being configured to receive a label.

23. The outlet-unit assembly of claim 16, wherein the locking lever includes a hook portion configured to engage a shoulder of the plug to retain the plug within the at least one outlet.

24. The outlet-unit assembly of claim 23, wherein the locking lever is configured to flex or bend to release the plug from the at least one outlet.

25. The outlet-unit assembly of claim 16, wherein the at least two types of plugs include at least four types of plugs.

26. The outlet-unit assembly of claim 16, wherein the at least one outlet unit further includes a grounding tab configured to be coupled to the chassis.

27. The outlet-unit assembly of claim 26, wherein the grounding tab is configured to wrap around the base of the at least one outlet unit and is connected to the chassis by a fastener.

28. An outlet-unit assembly, comprising:

at least one outlet unit configured to be coupled to a chassis, the at least one outlet unit including at least one outlet configured to receive at least two types of plugs and a grounding tab configured to be coupled to the chassis, wherein the grounding tab is connected to the chassis by a fastener.

29. The outlet-unit assembly of claim 28, wherein the grounding tab is configured to wrap around a base of the at least one outlet unit.

30. The outlet-unit assembly of claim 28, wherein the at least two types of plugs include at least four types of plugs.

* * * * *